United States Patent
Zheng

(10) Patent No.: US 7,573,923 B2
(45) Date of Patent: Aug. 11, 2009

(54) LASER DRIVE CIRCUIT AND METHOD PROVIDING HIGH LIMIT CLIPPING CORRESPONDING TO LOW LIMIT CLIPPING IN A LASER

(75) Inventor: Jun Zheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 11/775,409

(22) Filed: Jul. 10, 2007

(65) Prior Publication Data

US 2009/0016389 A1 Jan. 15, 2009

(51) Int. Cl.
*H01S 3/00* (2006.01)
(52) U.S. Cl. .............. 372/38.07; 372/38.1; 372/38.02
(58) Field of Classification Search ............ 372/38.1, 372/38.01, 38.07
See application file for complete search history.

(56) References Cited

U.S. PATENT DOCUMENTS

| | | | |
|---|---|---|---|
| 4,242,636 A | 12/1980 | Gilmer et al. | |
| 5,187,713 A | 2/1993 | Kwa | |
| 5,343,843 A | 9/1994 | Hamren | |
| 5,600,472 A | 2/1997 | Uesaka | |
| 5,680,238 A | 10/1997 | Masuda | |
| 5,689,356 A | 11/1997 | Rainal | |
| 5,751,531 A * | 5/1998 | Rault | 361/56 |
| 6,061,161 A | 5/2000 | Yang et al. | |
| 6,118,479 A | 9/2000 | Maeda et al. | |
| 6,181,453 B1 | 1/2001 | Darcie et al. | |
| 6,211,984 B1 | 4/2001 | Yoshida | |
| 6,549,316 B2 | 4/2003 | Blauvelt | |
| 6,559,994 B1 | 5/2003 | Chen et al. | |
| 6,727,761 B1 * | 4/2004 | Apel | 330/295 |
| 6,728,277 B1 | 4/2004 | Wilson | |

OTHER PUBLICATIONS

Pophillat, L., "Optical Modulation Depth Improvement in SCM Lightwave Systems Using a Dissymmetrization Scheme", IEEE Photonics Technology Letters, vol. 6, No. 6, Jun. 1994, pp. 750-753.
Ciciora, Walter; Farmer, James; Large, David; Adams, MIchael, "Modern Cable Television Technology—Video, Voice, and Data Communications", Second Edition, Morgan Kaufmann Publishers, 2004, Chapter 12, pp. 530-557, and Glossary pp. 1003-1004.

(Continued)

*Primary Examiner*—Minsun Harvey
*Assistant Examiner*—Yuanda Zhang
(74) *Attorney, Agent, or Firm*—Norman Stephan Kinsella; Grossman, Tucker, Perreault & Pfleger PLLC

(57) ABSTRACT

A laser drive circuit may be used to induce high limit clipping corresponding to natural low limit clipping in a laser, such as a laser diode, to reduce even order distortion such as composite second order (CSO) distortion. A drive current input may be provided to the active region of the laser to produce a modulated optical output in response to the drive current input. The laser drive circuit may include a current clamp at the drive current input, which clamps the drive current to provide the high limit clipping. The current clamp may receive an input current including current from a RF signal provided by a RF source together with a bias current provided by a bias current source.

15 Claims, 3 Drawing Sheets

OTHER PUBLICATIONS

PCT Search Report and Written Opinion received in related Application No. PCT/US08/64682 dated Jul. 22, 2008, 8 pgs.

PCT Search Report and Written Opinion received in related Application No. PCT/US08/64684 dated Jul. 23, 2008, 9 pgs.

* cited by examiner

US 7,573,923 B2

LASER DRIVE CIRCUIT AND METHOD PROVIDING HIGH LIMIT CLIPPING CORRESPONDING TO LOW LIMIT CLIPPING IN A LASER

TECHNICAL FIELD

The present invention relates to modulated optical systems and more particularly, to a laser drive circuit and method that provides high limit clipping corresponding to low limit clipping in a laser to reduce even order distortion in modulated optical systems.

BACKGROUND INFORMATION

A laser may be used as an optical transmitter that transmits light at a given wavelength. The power (i.e., amplitude) of the laser light may be modulated by corresponding modulation of the power used to drive the laser. In a directly-modulated electrically pumped semiconductor laser such as a laser diode, the electrical current that drives or pumps the laser is modulated. The relationship between the light output and the input current for such a laser may be represented using a transfer curve or L-I (light-current) curve. The set point of the L-I curve may be selected so as to maximize the linearity of the laser output in response to the modulation, within the expected range of operation of the output produced by the laser. Although the laser output may be generally linear along a significant portion of the L-I curve, the light output may attain a zero-power level when the input current falls below a threshold current level, which results in an effect known as clipping.

In a communications system where multiple channels are transmitted, such as a CATV system, multiple analog signals corresponding to the multiple channels may be combined into a wide-band multichannel RF signal, which drives a laser to produce a multichannel modulated optical signal. The multiple analog signals may include multiple modulated analog carriers that may be combined, for example, using frequency division multiplexing techniques. One or more digital signals modulated using digital modulation, such as quadrature amplitude modulated (QAM), may also be combined with the modulated analog carrier signals, for example, using subcarrier multiplexing (SCM) techniques. In some systems, for example, as many as 110 channels may be transmitted over a frequency range of about 50 MHz to 750 MHz.

Because the modulation may carry several channels of information at different frequencies, there may be a very large swing of the input drive current in either direction. When many signals are summed and are randomly distributed in both frequency and phase, the ratio of peak-to-average voltage rarely exceeds 14 dB (though with occasional higher peaks). In a CATV system, however, the downstream spectrum is not random. Peak voltage conditions may occur, for example, when a large number of carriers are harmonics of a common root frequency and the carrier phases are aligned. In that case, the time domain waveform can resemble a string of impulses spaced by a time interval equal to the period of the common root frequency. As a result of this occasionally occurring peak voltage (and thus peak drive current) condition, the laser may be driven into hard limiting, causing clipping, when a sufficient number of carriers are in phase alignment. This is particularly true in the case of directly modulated laser diodes, as described above, where a sharp knee occurs in the transfer function below which the light output reaches a zero-power level.

In other words, there will be clipping when the instantaneous sum of various signals causes the drive current to swing too far in the "downward" direction and below the threshold current that turns on the laser. When such clipping occurs, intermodulation products (i.e., clipping-induced distortion) and noise may be generated, which may result in bit errors in the optical output of the laser. When polarity of a sine wave is clipped, both even and odd order distortion products may be generated, although second order distortion products are the largest.

The even-order distortion includes composite second order (CSO) distortion products, i.e. distortion products of the type $2f_1$, $2f_2$, $f_2-f_1$, and $f_2+f_1$. In particular, CSO is a second-order distortion that combines signals at frequencies A and B, as $A\pm B$. The odd-order distortion includes composite triple beat (CTB) distortion. CTB (also known as C/CTB) is a third-order distortion product that combines signals at frequencies A, B, and C as A+B−C. For optical transmitters modulated externally with Mach-Zehnder external modulators, the non-linearities are symmetrical and the limiting is "softer," resulting in less clipping and primarily odd-order distortion. For directly-modulated DFB lasers, however, both CSO and CTB will show an increase when such clipping happens with sufficient frequency to be statistically significant.

BRIEF DESCRIPTION OF THE DRAWINGS

These and other features and advantages will be better understood by reading the following detailed description, taken together with the drawings wherein.

DETAILED DESCRIPTION

Figure 1:
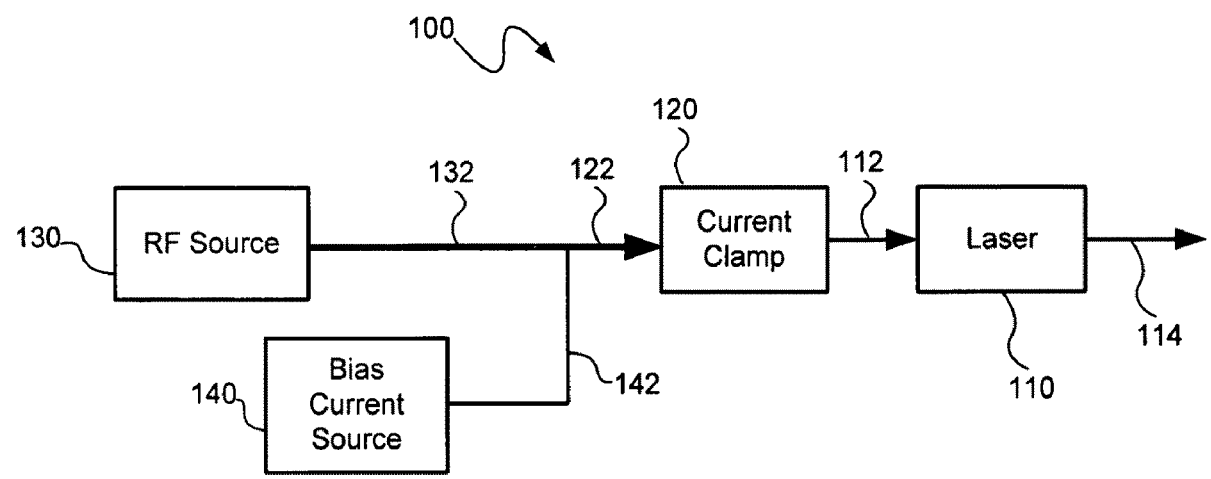
FIG. 1 is a functional block diagram of a laser drive circuit including a current clamp to reduce even order distortion in a modulated optical system, consistent with an embodiment of the present invention.

Referring to FIG. 1, a laser drive circuit 100, consistent with embodiments of the present invention, may be used to induce high limit clipping corresponding to natural low limit clipping in a laser 110. As will be described in greater detail below, the high limit clipping may reduce the effects of clipping distortion. The laser 110 may receive a drive current input 112 provided to the active region of the laser 110 to produce a modulated optical output 114. The laser drive circuit 100 may include a current clamp 120 at the drive current input 112, which clamps the drive current to provide the high limit clipping. The current clamp 120 may receive an input current 122 including, for example, current from a RF signal 132 provided by a RF source 130 together with a bias current 142 provided by a bias current source 140.

The RF signal 132 may be a multichannel RF signal including multiple superimposed modulated analog carriers at different frequencies. The multiple modulated analog carriers may be modulated using modulation techniques known to those skilled in the art, such as amplitude modulation, and may be combined using multiplexing techniques known to those skilled in the art, such as frequency division multiplexing. The multichannel RF signal 132 may also include one or more digital signals modulated using digital modulation, such as quadrature amplitude modulation (QAM). The resulting multichannel RF signal 132 occupies a bandwidth across the range of frequencies of the multiple modulated carriers. Those skilled in the art will recognize that various modulation and multiplexing techniques may be used to generate the multichannel RF signal.

In one embodiment, the multichannel RF source 130 may include headend equipment in a CATV system and the multichannel RF signal 132 may be a downstream CATV signal. Examples of downstream multichannel CATV signals include 77 channels transmitted over a frequency range of about 50 MHz to 550 MHz and 110 channels transmitted over a frequency range of about 50 MHz to 750 MHz. Each channel in a downstream multichannel CATV signal may include a video carrier, a color subcarrier and an audio carrier. Other types of signals and frequency ranges may also be transmitted. The bias current source 140 may include any type of bias current source and/or bias current control used to bias a laser diode, for example, in an optical transmitter.

In the exemplary embodiment, each channel in the multichannel RF signal 132 may be driven or modulated up to a certain optical modulation index (OMI) depending upon a desired channel-to-noise ratio (CNR). In one embodiment, the OMI of at least some of the channels may be in a range of about 2% to 5%. When multiple modulated carriers of the multichannel RF signal 106 align in phase, the sum of the voltage of the aligned carriers may result in a peak voltage condition. When the optical modulation index (OMI) of each channel exceeds a certain level (e.g., exceeding about 3% OMI per channel), the peak voltage condition may result in a higher occurrence of negative voltage spikes or peaks that cause the laser input current to fall below a threshold current of the laser 110, resulting in clipping.

Figure 2A:
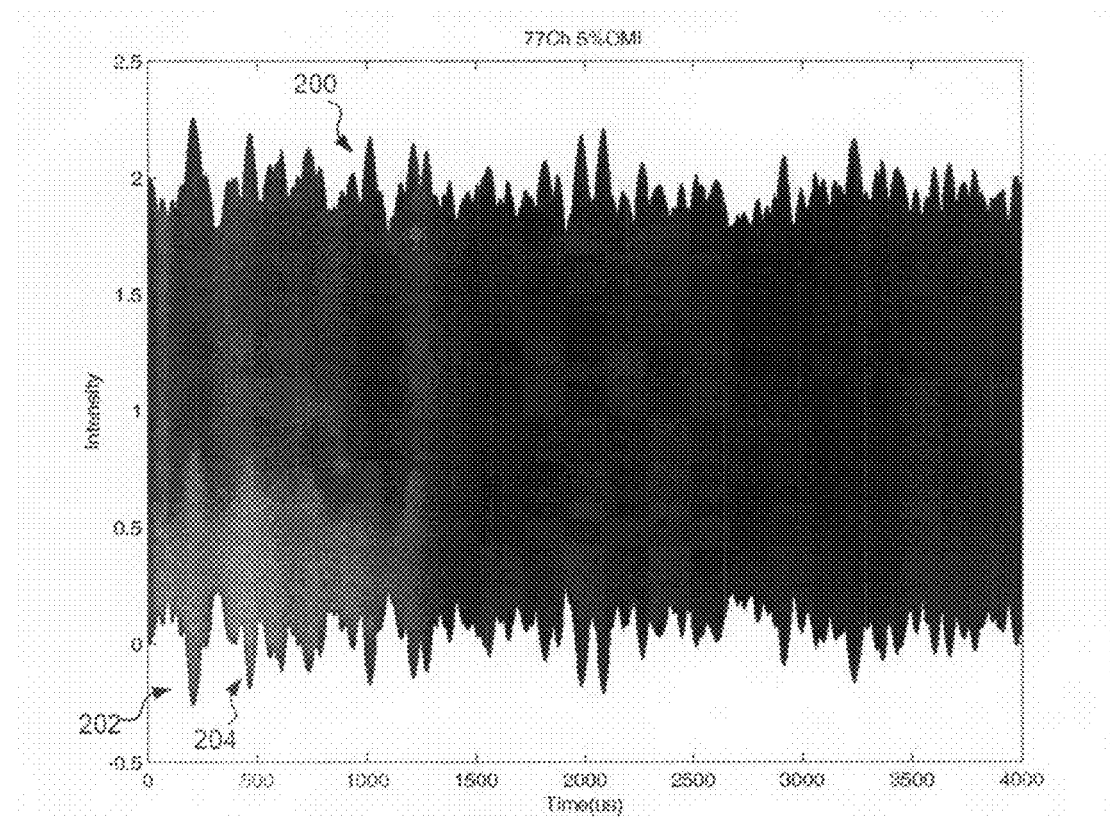
FIGS. 2A and 2B illustrate portions of an exemplary waveform of a multichannel RF signal in a multichannel modulated optical system.
Figure 2B:
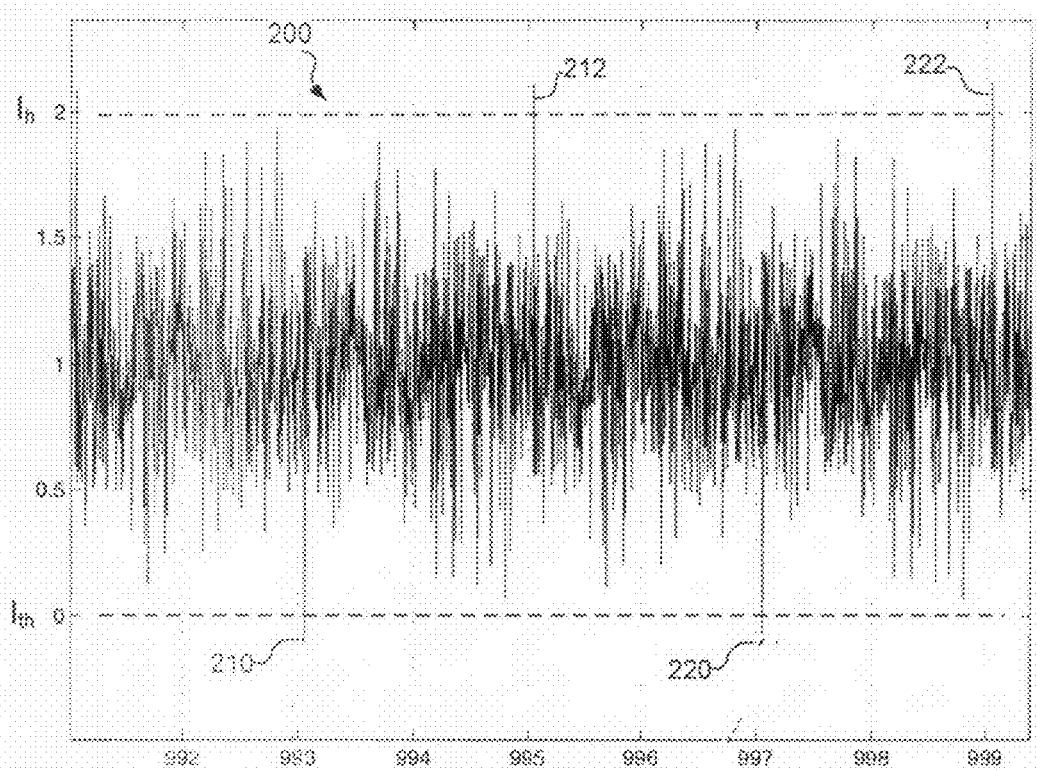

Referring to FIGS. 2A and 2B, an exemplary multichannel RF drive signal 200 is shown. The exemplary multichannel RF drive signal 200 represents 77 channels transmitted with 5% OMI per channel. FIG. 2A shows the RF drive signal 200 over a period of about 4000 μs with a number of peak voltage conditions 202, 204 during which multiple modulated carriers align in phase.

FIG. 2B shows the RF drive signal 200 over a smaller time period (i.e., about 10 μs) during a peak voltage condition. During the peak voltage condition shown in FIG. 2B, the multichannel RF drive signal 200 includes negative spikes or peaks 210, 220 that occur, for example, when carriers align to produce a relatively large swing in drive current in the negative direction. The negative spikes or peaks 210, 220 generally correspond to positive spikes or peaks 212, 222 produced by a corresponding relatively large swing in drive current in the positive direction. Low limit clipping occurs when the negative spikes 210, 220 cause the drive current to fall below a threshold current ($I_{th}$) for the laser. In the exemplary RF drive signal 200, the negative peaks 210, 220 (and the resulting clipping) occur periodically during the peak voltage condition (e.g., about every 4 microseconds (μs)). By clamping the current of the RF signal 200 at a maximum or high limit current ($I_h$), as described in greater detail below, high limit clipping may be induced in the corresponding positive spikes 212, 222.

Figure 3:
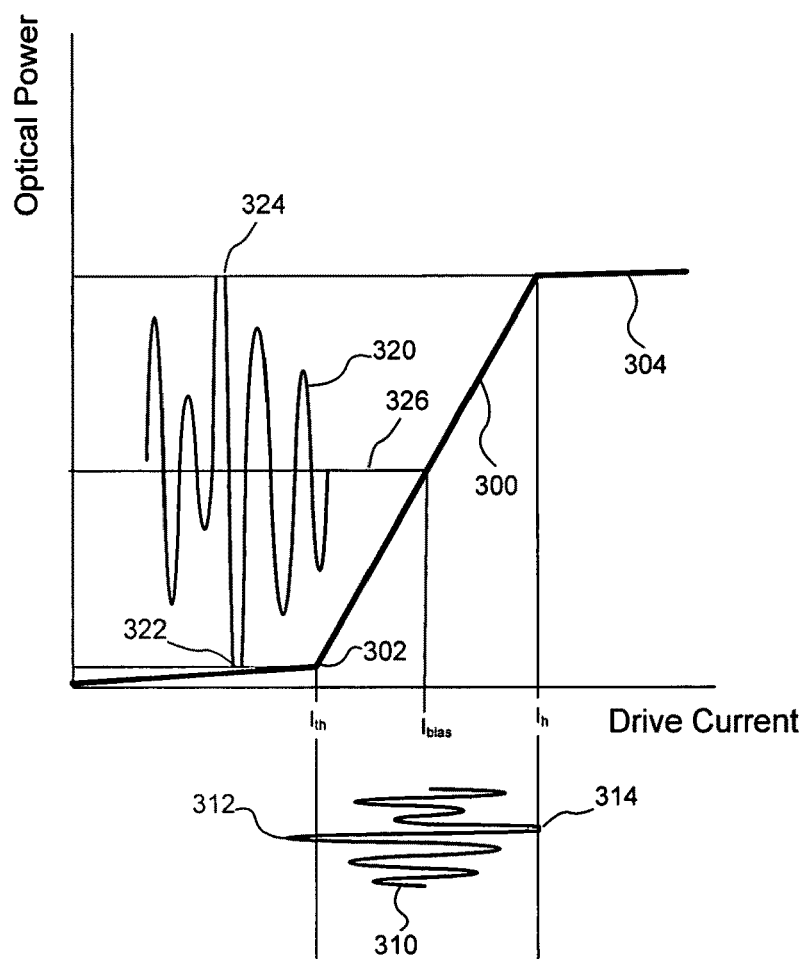
FIG. 3 illustrates a transfer curve showing the relationship between drive current and light output for a laser drive circuit including a current clamp, consistent with an embodiment of the present invention.

The laser 110 may include a semiconductor laser, such as a laser diode, having an L-I curve with a sharp knee or point at which the light output reaches a zero level when the input current falls below the threshold current ($I_{th}$). Referring to FIG. 3, a transfer curve 300 of one example of a laser diode illustrates the relationship between drive current (I) and light output (L) of a laser diode. Drive current waveform 310 represents the clamped input drive current applied to the laser diode and optical output waveform 320 represents an optical output produced by the clamped input drive current. The point 302 (also referred to as the knee) of the transfer curve 300 represents a laser threshold point. When the drive current falls below a threshold current ($I_{th}$) corresponding to the laser threshold point, there is a sharp discontinuity in the light output. Thus, when the drive current falls below the threshold current as represented by negative peak 312 in drive current waveform 310, the optical output abruptly stops as represented by the clipped negative peak 322 in the optical output waveform 320.

To provide high limit clipping, the input drive current as represented by drive current waveform 310 is clamped at the high limit current ($I_h$) resulting in a clamped peak 314, for example, when the combined the RF signal and bias current exceeds the high limit current ($I_h$). Thus, when the input drive current is clamped at the high limit current ($I_h$), the optical output abruptly stops as represented by the clipped positive peak 324 in the optical output waveform 320. As a result of the high limit clipping, the transfer curve 300 effectively has a flat portion 304 corresponding to the high limit clipping.

The high limit current ($I_h$) may be selected such that the high limit clipping is substantially symmetrical to the low limit clipping that occurs when the drive current falls below the threshold current ($I_{th}$) of the laser. In other words, the clipped negative peak 322 and the clipped positive peak 324 extend by a substantially equal amount below and above some baseline or unmodulated level 326 corresponding to the bias current ($I_{bias}$). The high limit current ($I_h$) is thus based on the threshold current ($I_{th}$) of the laser and the bias current ($I_{bias}$). The degree to which the high limit clipping and the low limit clipping are symmetrical may depend upon the clipping distortion that can be tolerated in a particular system, as discussed below.

By making the high limit clipping substantially symmetrical with the low limit clipping, composite second order (CSO) distortion may be reduced because CSO distortion is even-order and symmetrical. Although composite triple beat (CTB) distortion may be increased by the high limit clipping, the magnitude of the CTB distortion is generally smaller than CSO distortion and may be tolerated. Thus, CSO distortion may be reduced at the cost of increasing CTB distortion, which results in a "softer" limiting because the non-linearities are more symmetrical. The laser drive circuit and method, consistent with embodiments of the present invention, thus produce the unexpected and unpredictable result of reducing the effects of clipping distortion by inducing high limit clipping. The laser drive circuit and method described herein may be especially useful in applications where CSO distortion is a problem but CTB distortion can be tolerated.

Figure 4:
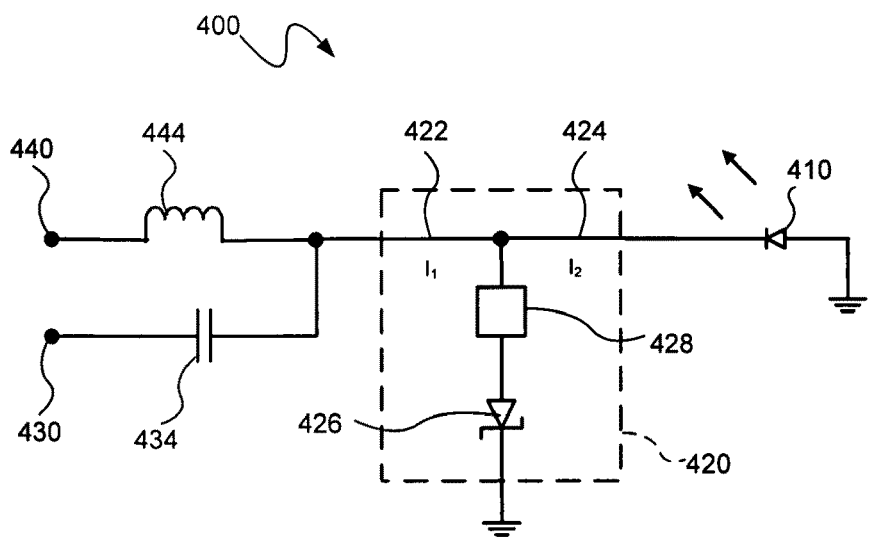
FIG. 4 is a schematic diagram of a laser drive circuit including a current clamp, consistent with another embodiment of the present invention.

Referring to FIG. 4, an embodiment of a laser drive circuit 400 including a laser diode 410 and a current clamp 420 is described in greater detail. A modulating (AC) signal (i.e., the RF signal) may be applied to node 430 through capacitor 434 and a DC level current may be applied to node 440 through inductor 444. The combined current ($I_1$) of the AC signal and DC level (i.e., the combined RF signal and bias current) is applied as the input 422 to the current clamp 420, and a clamped current ($I_2$) is provided at the output 424 of the current clamp 420 to the input of the laser diode 410. The current clamp 420 thus clamps the current injected into the input of laser diode 410 to the maximum or high limit current ($I_h$) as discussed above.

According to this embodiment, the current clamp 420 includes a zener diode 426 and another circuit element 428 such as a resistor. When the input current ($I_1$) to the current clamp 420 exceeds the high limit current ($I_h$), the zener diode 426 drains away the excess current so that the clamped current ($I_2$) at the output 424 of the current clamp 420 does not exceed the high limit current ($I_h$), thereby causing high limit clipping of the optical output of the laser diode 410. The circuit element 428 and the zener diode 426 may be selected and configured based on the desired high limit current ($I_h$). The zener diode 426, for example, may have a rated breakdown voltage or zener voltage that prevents current through the current clamp 420 from exceeding the desired high limit current ($I_h$). As mentioned above, the desired high limit current ($I_h$) may be based on the threshold current ($I_{th}$) and bias current ($I_{bias}$) of the laser 410 such that the high limit clipping caused by the current clamp 420 is substantially symmetrical with the low limit clipping that occurs in the laser diode 410.

Accordingly, a laser drive circuit, consistent with embodiments of the present invention, clamps a drive current to a laser to provide high limit clipping corresponding to the natural low limit clipping that occurs in the laser. The high limit clipping may be substantially symmetrical to the low limit clipping to reduce CSO distortion.

Consistent with one embodiment, a laser drive circuit includes a laser including a drive current input configured to receive a drive current and an optical output configured to provide a modulated optical signal in response to the drive current. The laser has a threshold current such that low limit clipping occurs when the drive current to the laser falls below the threshold current. The laser drive circuit also includes a current clamp including an input configured to receive at least a RF signal and an output configured to provide a clamped current to the drive current input of the laser diode. The current clamp is configured to clamp the current of the RF signal to a high limit current such that the clamped current provided to the drive current input of the laser diode provides high limit clipping corresponding to the low limit clipping that occurs in the laser.

Consistent with another embodiment, a method includes providing a RF signal including a plurality of positive spikes and a plurality of negative spikes; clamping a current of at least the RF signal to a high limit current to provide a clamped drive current; providing the clamped drive current to an input of a laser such that the clamped drive current provides high limit clipping corresponding to low limit clipping that occurs in the laser; and providing a modulated optical signal from the laser.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A laser drive circuit comprising:
    a laser including a drive current input configured to receive a drive current and an optical output configured to provide a modulated optical signal in response to the drive current, the laser having a threshold current such that low limit clipping occurs when the drive current to the laser falls below the threshold current; and
    a current clamp including an input configured to receive at least a RF signal and an output configured to provide a clamped current to the drive current input of the laser, the RF signal including negative peaks produced by a relatively large swing in drive current in a negative direction and including corresponding positive peaks produced by a corresponding relatively large swing in drive current in a positive direction, wherein the low limit clipping occurs in the laser when the negative peaks of the RF signal fall below the threshold current of the laser, the current clamp being configured to clamp the current of the RF signal to a high limit current such that the clamped current provided to the drive current input of the laser provides high limit clipping of the positive peaks corresponding to the negative peaks that cause the low limit clipping to occur in the laser, wherein the modulated optical signal includes high limit clipping substantially symmetrical to the low limit clipping that occurs in the laser.

2. The laser drive circuit of claim 1 wherein the laser includes a laser diode.

3. The laser drive circuit of claim 1 wherein the current clamp is configured to receive a bias current combined with the RF signal.

4. The laser drive circuit of claim 3 further comprising a capacitor coupled to a node configured to receive the RF signal and an inductor coupled to a node configured to receive the bias current.

5. The laser drive circuit of claim 1 wherein the current clamp is configured to provide high limit clipping that is substantially symmetrical with the low limit clipping in the laser.

6. The laser drive circuit of claim 1 wherein the current clamp includes a zener diode.

7. The laser drive circuit of claim 6 wherein the current clamp includes a resistor coupled to the zener diode.

8. The laser drive circuit of claim 1 wherein the RF signal includes a superposition of multiple modulated carriers.

9. The laser drive circuit of claim 7 wherein the RF signal occupies a bandwidth over a frequency range of about 50 MHz to 1000 MHz.

10. A method comprising:
    providing a RF signal including negative peaks produced by a relatively large swing in drive current in a negative direction and including corresponding positive peaks produced by a corresponding relatively large swing in drive current in a positive direction;
    clamping a current of at least the RF signal to a high limit current to provide a clamped drive current;
    providing the clamped drive current to an input of a laser, wherein low limit clipping occurs in the laser when the negative peaks of the RF signal fall below a threshold current of the laser and wherein the clamped drive current provides high limit clipping of the corresponding positive peaks corresponding to the negative peaks that cause the low limit clipping to occur in the laser; and
    providing a modulated optical signal from the laser, wherein the modulated optical signal includes high limit clipping substantially symmetrical to the low limit clipping that occurs in the laser.

11. The method of claim 10 further comprising providing a bias current, and wherein clamping the current includes clamping a combined current of the RF signal and the bias current.

12. The method of claim 10 wherein the RF signal a superposition of multiple modulated carriers.

13. The method of claim 12 wherein the RF signal occupies a bandwidth over a frequency range of about 50 MHz to 750 MHz.

14. The method of claim 10 wherein the high limit clipping is substantially symmetrical with the low limit clipping.

15. The method of claim 10 wherein clamping the current includes passing the current through a current clamp including at least a zener diode.

* * * * *